US008957680B2

(12) United States Patent
Mori (10) Patent No.: US 8,957,680 B2
(45) Date of Patent: Feb. 17, 2015

(54) MAGNETIC SENSOR AND PATTERN FOR MAGNETIC SENSOR

(75) Inventor: Daisuke Mori, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 289 days.

(21) Appl. No.: 13/466,226

(22) Filed: May 8, 2012

(65) Prior Publication Data

US 2012/0306489 A1 Dec. 6, 2012

(30) Foreign Application Priority Data

Jun. 3, 2011 (JP) ................................. 2011-125093

(51) Int. Cl.
*G01R 33/02* (2006.01)
*G01R 33/06* (2006.01)
*G01B 7/30* (2006.01)
*G01R 33/09* (2006.01)

(52) U.S. Cl.
CPC .................................... *G01R 33/096* (2013.01)
USPC ................... 324/252; 324/207.21; 324/207.25

(58) Field of Classification Search
CPC .. G01R 33/091; G01R 33/095; G01R 33/096; G01R 33/10
USPC ......................................................... 324/252
See application file for complete search history.

(56) References Cited

U.S. PATENT DOCUMENTS

| | | | | |
|---|---|---|---|---|
| 5,134,371 A | * | 7/1992 | Watanabe et al. | 324/252 |
| 5,585,719 A | | 12/1996 | Endo et al. | |
| 5,621,320 A | * | 4/1997 | Yokotani et al. | 324/252 |
| 6,100,686 A | * | 8/2000 | Van Delden et al. | 324/252 |
| 7,279,891 B1 | * | 10/2007 | Chilcote et al. | 324/252 |
| 7,312,609 B2 | * | 12/2007 | Schmollngruber et al. | 324/252 |
| 7,400,143 B2 | * | 7/2008 | Hayashi et al. | 324/252 |
| 7,592,803 B1 | * | 9/2009 | Guo et al. | 324/207.25 |
| 7,859,258 B2 | * | 12/2010 | Sasaki et al. | 324/252 |

(Continued)

FOREIGN PATENT DOCUMENTS

| | | |
|---|---|---|
| JP | 07-004988 | 1/1995 |
| JP | 08-242027 A | 9/1996 |
| JP | 2008-170359 | 7/2008 |

OTHER PUBLICATIONS

Translation of JP H07-004988.*

(Continued)

*Primary Examiner* — Jermele M Hollington
*Assistant Examiner* — Christopher McAndrew
(74) *Attorney, Agent, or Firm* — Roberts Mlotkowski Safran & Cole P.C.

(57) ABSTRACT

A magnetic sensor includes a substrate, and a pattern forming region on the substrate, the pattern forming region having a substantially quadrangle shape. The pattern forming region includes a magnetic detection element pattern that includes a plurality of linear parts arranged parallel to each other at a predetermined inclination angle to two sides of the quadrangle shape, and a plurality of turning parts configured to alternately connect both end portions in a longitudinal direction of adjacent linear parts of the plurality of linear parts. The magnetic detection element pattern further includes a first pattern, and a second pattern with a resistance change ratio less than the first pattern. An area of the magnetic detection element pattern is less than an area of the pattern forming region in a plane view.

6 Claims, 6 Drawing Sheets

(56) References Cited

U.S. PATENT DOCUMENTS

2001/0020847 A1* 9/2001 Mattheis et al. ......... 324/207.21
2009/0315552 A1* 12/2009 Ando et al. .................. 324/252

OTHER PUBLICATIONS

JP Office Action dated Apr. 21, 2014 and partial English translation.
JP Office Action dated May 27, 2014 and partial English translation.

* cited by examiner

MAGNETIC SENSOR AND PATTERN FOR MAGNETIC SENSOR

The present application is based on Japanese patent application No. 2011-125093 filed on Jun. 3, 2011, the entire contents of which are incorporated herein by reference.

BACKGROUND OF THE INVENTION

1. Field of the Invention

This invention relates to a magnetic sensor configured to detect magnetic field and a pattern for a magnetic sensor.

2. Description of the Related Art

As one example of a magnetic sensor, a magnetoresistive element circuit configured to, for example, form a Wheatstone bridge by connecting four magnetoresistive elements is proposed (For example, refer to JP-A-H08-242027). The conventional magnetoresistive element circuit is configured such that the four magnetoresistive elements are arranged point-symmetrically with a center focus on an intersection point of diagonal lines of a square in the right angle direction.

Each pattern forming region of the four magnetoresistive elements has a contour shape of square in a plan view. The respective four magnetoresistive elements are formed in a turning shape that alternately connects both end portions in the longitudinal direction of a plurality of linear patterns adjacent to each other that are arranged parallel to each other along the diagonal line of the square. The longitudinal direction of the linear patterns corresponds to a magnetic field detection direction, and the linear patterns are configured to be increased in the length by that the linear patterns are turned, thereby the magnetoresistive elements are increased in the resistance.

SUMMARY OF THE INVENTION

The conventional magnetoresistive element described in JP-A-H08-242027 is configured such that the turning patterns are gradually reduced in the length in accordance with that both end portions of the linear patterns come close to the two corners on the diagonal line of the square forming the pattern forming region. Consequently, in the two corners on the diagonal line of the square, the resistance change ratio in the magnetic field detection direction is gradually reduced. As a result, the output amplitude of the whole magnetoresistive element circuit is reduced, thus sufficient magnetic field detection sensitivity cannot be obtained.

Therefore, it is an object of the invention to provide a magnetic sensor that has excellent magnetic field detection sensitivity, and a pattern for the magnetic sensor.

(1) According to one embodiment of the invention, a magnetic sensor comprises:

a substrate; and a pattern forming region on the substrate, the pattern forming region having a substantially quadrangle shape, wherein the pattern forming region comprises a magnetic detection element pattern that comprises a plurality of linear parts arranged parallel to each other at a predetermined inclination angle to two sides of the quadrangle shape, and a plurality of turning parts configured to alternately connect both end portions in a longitudinal direction of adjacent linear parts of the plurality of linear parts, and wherein the magnetic detection element pattern further comprises a first pattern, and a second pattern with a resistance change ratio less than the first pattern, and wherein an area of the magnetic detection element pattern is less than an area of the pattern forming region in a plane view.

In the above embodiment (1) of the invention, the following modifications and changes can be made.

(i) The second pattern has a resistance ratio of the turning parts to the linear parts, the resistance ratio being not more than a predetermined value.

(ii) The pattern forming region has a substantially rectangle shape, and the plurality of linear parts of the magnetic detection element pattern are arranged parallel to each other at the inclination angle of 45 degrees to two long sides of the rectangle shape opposite to each other.

(iii) The pattern forming region has a substantially square shape, and the plurality of linear parts of the magnetic detection element pattern are arranged parallel to each other along a diagonal line of the square shape.

(iv) The pattern forming region further comprises a dummy pattern formed in a region without the magnetic detection element pattern.

(v) The magnetic detection element pattern is arranged point-symmetrically with a center focus on an intersection point of diagonal lines of the pattern forming region.

(vi) The magnetic sensor further comprises a plurality of magnetic detection elements on the substrate, wherein the magnetic detection elements comprise the pattern forming region having a same shape and the magnetic detection element pattern having a same shape.

(2) According to another embodiment of the invention, a pattern for a magnetic sensor comprises:

a magnetic detection element pattern comprising a plurality of linear parts arranged parallel to each other at a predetermined inclination angle to two sides of a pattern forming region having a substantially quadrangle shape, and a plurality of turning parts configured to alternately connect both end portions in the longitudinal direction of the linear parts adjacent to each other, wherein the magnetic detection element pattern is formed except a part of a corner portion of the pattern forming region in which a resistance ratio of the turning part to resistance of the linear part is more than a predetermined value.

In the above embodiments (1) and (2) of the invention, the following modifications and changes can be made.

(vii) The predetermined value is 8%.

POINTS OF THE INVENTION

According to one embodiment of the invention, a magnetic sensor is constructed such that an area of the magnetic detection element pattern is less than an area of the pattern forming region in a plane view. Thereby, the output amplitude can be prevented from decreasing.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

The preferred embodiments according to the invention will be explained below referring to the drawings

First Embodiment

Configuration of Magnetic Sensor

Figure 1:
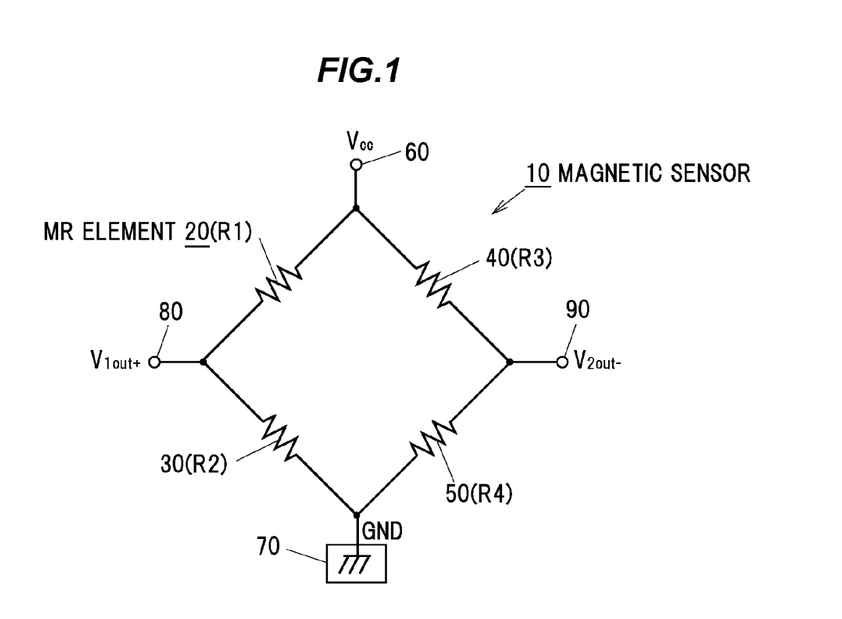
FIG. 1 is a typical electrical circuit diagram of a magnetic sensor according to a first embodiment of the invention.

In FIG. 1, the whole magnetic sensor as one example is shown by a code 10. The magnetic sensor 10 includes an equivalent circuit (full bridge circuit) configured such that four MR elements (magnetoresistive elements) 20, 30, 40, 50 that are magnetic detection elements are connected to each other in a Wheatstone bridge shape.

As shown in FIG. 1, the four MR elements 20, 30, 40, 50 are configured to change electrical resistances R1 to R4 in accordance with directional change of magnetic field (directional change of magnetic flux) caused by a magnet to the magnetic sensor 10. As the magnetic detection element, for example, a Hall element and a magnetoimpedance effect element are included other than the MR element 20.

As shown in FIG. 1, the MR element 20 and the MR element 40 are connected to each other in series, and simultaneously the MR elements 30 and 50 are connected to each other in series. The MR elements 20, 40 and the MR elements 30, 50 are connected to each other in parallel. An input terminal 60 connected to a power supply part (not shown) is formed between the MR element 20 and the MR element 40. An earth terminal 70 is formed between the MR element 30 and the MR element 50. An output terminal 80 from which midpoint potential $V_1$ is output is formed between the MR element 20 and the MR element 30. An output terminal 90 from which midpoint potential $V_2$ is output is formed between the MR element 40 and the MR element 50.

As shown in FIG. 1, the magnetic sensor 10 is configured to detect the directional change of magnetic field to the magnetic sensor 10 as a change in a potential difference between the midpoint potential $V_1$ and the midpoint potential $V_2$. The potential difference is output as an output voltage (output amplitude) V. The closer to 0 V the potential difference is, the higher performance the magnetic sensor 10 can achieve, thus the four MR elements 20, 30, 40, 50 are formed in a pattern forming region on a substrate (not shown) in a predetermined pattern such that the electrical resistances R1 to R4 are equalized.

The magnetic sensor 10 is configured such that the four MR elements 20, 30, 40, 50 are arranged point-symmetrically with a center focus on an intersection point of diagonal lines of a rectangle in the right angle direction. When magnetic field is applied in the longitudinal direction of the MR elements 20, 50, the resistance of the MR elements 20, 50 becomes maximum and the resistance of the MR elements 30, 40 becomes minimum. To the contrary, when magnetic field is applied in the longitudinal direction of the MR elements 30, 40, the resistance of the MR elements 30, 40 becomes maximum and the resistance of the MR elements 20, 50 becomes minimum.

Figure 2:
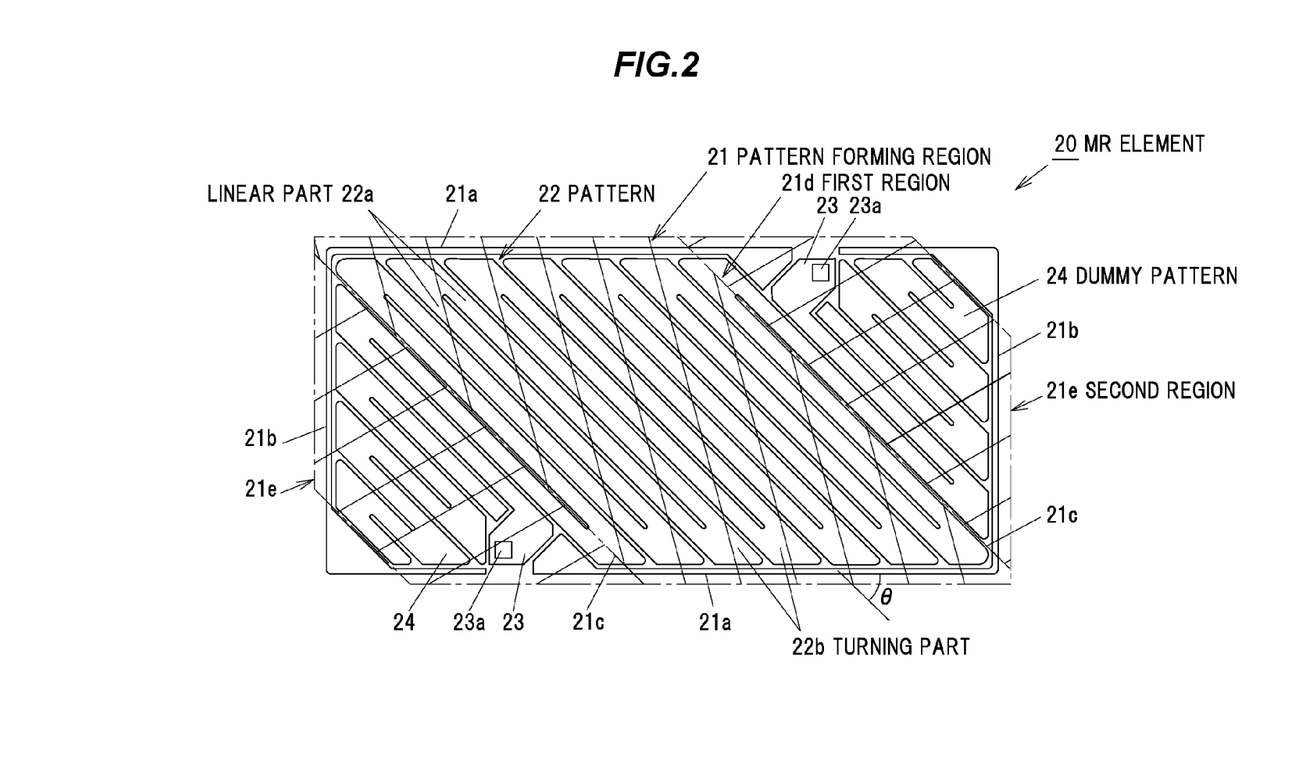
FIG. 2 is a plan view schematically showing a main part of a magnetoresistive element in the magnetic sensor according to the first embodiment of the invention.

Referring to FIG. 2, FIG. 2 shows a main part of the MR element 20 in the magnetic sensor 10. The MR elements 30, 40, 50 other than the MR element 20 have also the same structure and configuration.

The MR elements 20, 30, 40, 50 are composed of a ferromagnetic thin-film including nickel cobalt and the like or a high magnetic permeability thin-film such as amorphous, permalloy, and are formed on a pattern forming region on a non-magnetic substrate composed of oxide glass, alumina or the like as a magnetic resistance film by a film formation technique. An insulation film is formed between the substrate and the MR elements. A protection layer such as silicon nitride, silica dioxide is formed on the surface of the MR elements.

Pattern of the MR Element

Any of the four MR elements 20, 30, 40, 50 has the same structure and configuration, thus in the first embodiment, only the structure and configuration of the MR element 20 will be explained.

As shown in FIG. 2, the contour shape of the pattern forming region 21 of the magnetism sensing part in the MR element 20 is formed in a rectangle in a plan view. The MR element 20 includes a pattern 22 formed in a shape of a plurality of lines arranged parallel to each other at the inclination angle θ of 45 degrees to two long sides 21a, 21a of the rectangle opposite to each other. The pattern 22 has a plurality of linear parts 22a, ..., 22a extending at a predetermined equal length and a predetermined equal distance so as to have a large resistance change ratio, and simultaneously has a plurality of turning parts 22b, ..., 22b configured to alternately connect both end portions in the longitudinal direction of the linear parts 22a, ..., 22a adjacent to each other, so as to form a turning structure.

The longitudinal direction of the linear parts 22a of the pattern 22 corresponds to the magnetic field detection direction, and the linear patterns 22a are configured to be increased in the length of the magnetic field detection direction, thereby the MR element 20 is configured to be increased in the resistance, so that the magnetic field detection sensitivity is heightened. The inclination angle θ of the pattern 22 can be an angle other than 45 degrees, but it is preferable that the inclination angle θ is an angle other than 0 and 90 degrees.

As shown in FIG. 2, a metal pad 23 is formed in both end portions of the pattern 22 formed in a turning shape. The metal pad 23 is connected to the both end portions of the pattern 22 via a contact hole 23a. The MR element 20 is connected to the other MR elements 30, 40, 50 via a wiring (not shown) connected to the metal pad 23.

Pattern Forming Region of the MR Element

The configuration of the magnetic sensor 10 according to the first embodiment is mainly characterized by the pattern of the MR elements 20, 30, 40, 50 and the pattern forming region. Consequently, the magnetic sensor 10 according to the first embodiment is not limited to the above-mentioned configuration.

Figure 5:
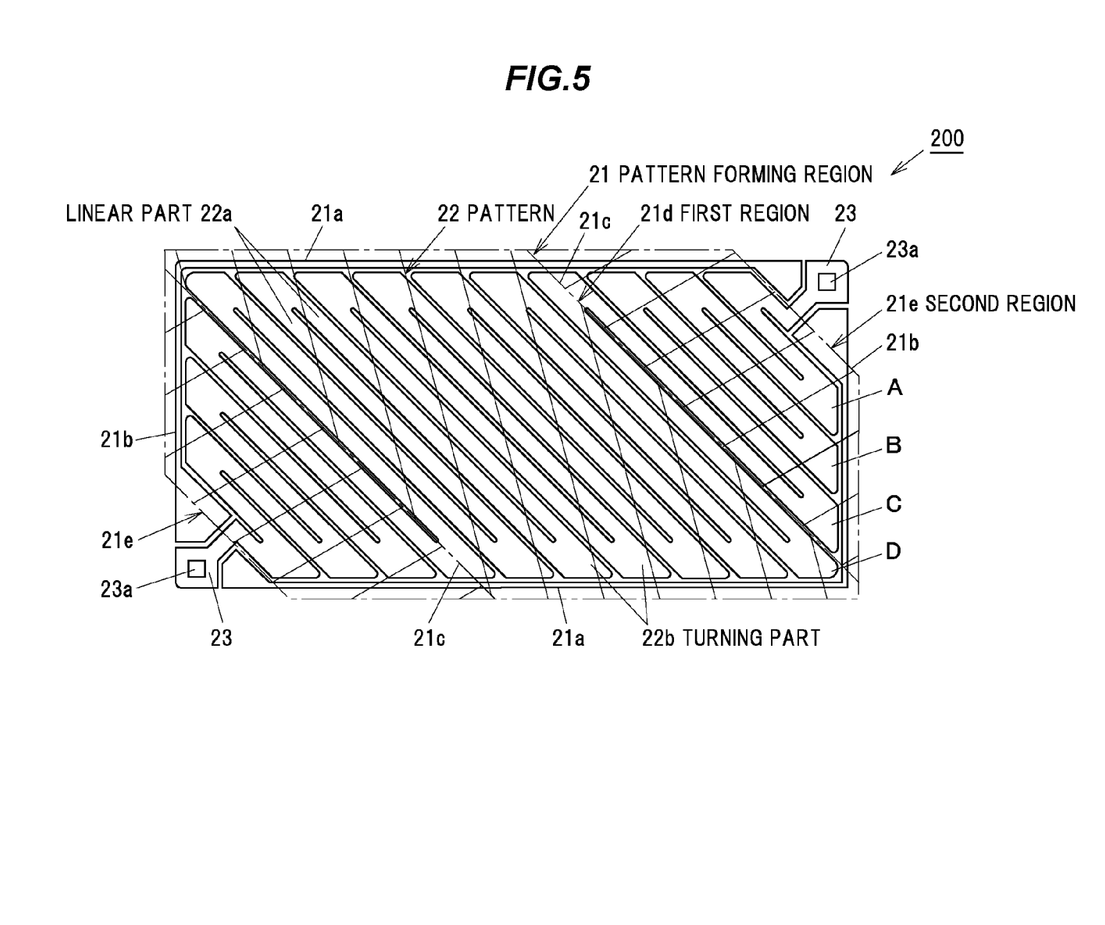
FIG. 5 is a plan view schematically showing a main part of a magnetoresistive element in a conventional magnetic sensor.

Referring to FIG. 5, FIG. 5 shows a main part of the MR element 200 in the conventional magnetic sensor. Further, in FIG. 5, to the substantively same elements as those of the first embodiment, the same element names and codes will be given.

Figure 6:
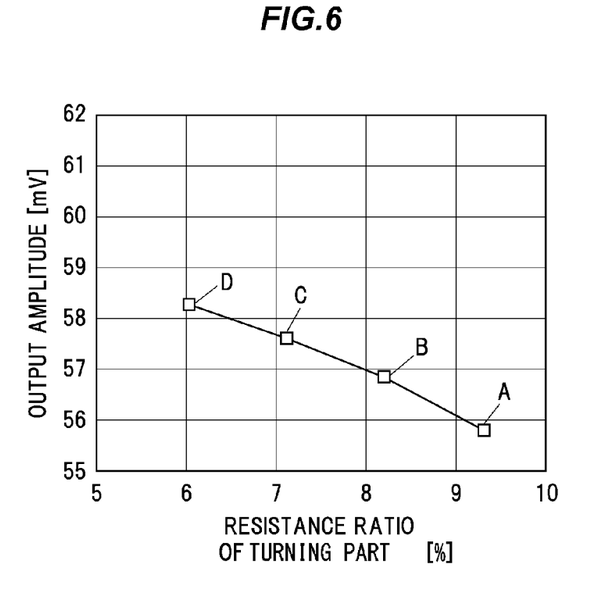
FIG. 6 is a graph obtained by plotting a relationship between resistance ratio of a turning part to resistance of a linear part, and output amplitude.

Here, for example, when a voltage of 3 V is applied to the MR element 200 formed in the pattern forming region 21 formed in a rectangle, a relationship between resistance ratio of the turning part 22b to resistance of the linear part 22a of the pattern 22 and output amplitude (output voltage) is shown in the following Table 1. The measurement points corresponding to codes A to D of Table 1 are shown in FIG. 5. In FIG. 6, a relationship between resistance ratio of the turning part 22b and the output amplitude shown in Table 1 is plotted on a graph.

TABLE 1

| Measurement point | A | B | C | D |
|---|---|---|---|---|
| Resistance ratio of turning part (%) | 9.3 | 8.2 | 7.1 | 6.0 |
| Output amplitude (mV) | 55.8 | 56.85 | 57.61 | 58.3 |

As is clear from Table 1, FIG. 5 and FIG. 6, the resistance ratio of the turning part 22b to the resistance of the linear part 22a of the pattern 22 of the MR element 200 becomes gradually smaller from the measurement point A to the measurement point D. The output amplitude of the measurement points A to D becomes gradually larger from the measurement point A to the measurement point D, and the output amplitude of the measurement point D is increased than that of the measurement point A by approximately 4.5%.

From these results, it is understood that in the pattern forming region 21 formed rectangular, a first region 21d is present that can provide a large output amplitude since the resistance ratio of the turning part 22b to the resistance of the linear part 22a of the pattern 22 is small, and a second region 21e is present that provides an output amplitude smaller than the first region 21d since the resistance ratio of the turning part 22b thereto increases.

In the first region 21d, the resistance ratio of the turning part 22b to the resistance of the linear part 22a of the pattern 22 is smaller than that of the second region 21e formed in the corner parts of a rectangle that becomes the pattern forming region 21. Therefore, the large output amplitude of the MR element 20 can be obtained, a large resistance change ratio to the directional change of magnetic field can be obtained, and sufficient magnetic field detection sensitivity can be obtained.

In the first embodiment, based on the above-mentioned result, as shown in FIG. 2, the rectangular pattern forming region 21 in which the pattern 22 of the MR element 20 is formed includes the first region 21d (i.e., a first pattern as claimed) in which the pattern 22 provides a high resistance change ratio and a part (i.e., a second pattern as claimed) of the second region 21e in which the pattern 22 provides a resistance change ratio less than the first region 21d (i.e., a first pattern as claimed).

Here, the resistance change ratio is defined as $(R_{max}-R_{min})/R_{min}\times 100$, if maximum value of resistance is given as $R_{max}$ and minimum value of resistance is given as $R_{min}$ when magnetic field is applied to the MR element 20.

As shown in FIG. 2, the first region 21d in the pattern forming region 21 has substantially a quadrangular shape surrounded by the two long sides 21a, 21a of the rectangle opposite to each other and the two diagonal line segments 21c, 21c parallel to each other intersecting with the long side 21a at an inclination angle θ of 45 degrees. On the other hand, the second region 21e has a trapezoid shape surrounded by the diagonal line segment 21c of the first region 21d, and the long side 21a and the short side 21b adjacent to each other constituting the two corner portions opposite to each other on the diagonal line of the rectangle.

As shown in FIG. 2, the MR element 20 is configured such that the pattern 22 is continuously formed in the first region 21d to provide the large resistance change ratio and a part of the second region 21e that does not determine a significant decrease (as discussed with respect to Table 1) in the resistance change ratio of the first region 21d. In the part (i.e., the second pattern) of the second region 21e, the MR element pattern 22 is formed such that the resistance change ratio does not decrease more than a predetermined value.

The second region 21e to provide the resistance change ratio smaller than the first region 21d does not contributes to the output amplitude of the MR element 20. Therefore, the second region 21e includes a non-pattern forming region that no MR element pattern is formed. In the embodiment shown in FIG. 2, a dummy pattern 24 without the MR element pattern is formed in the non-pattern forming region to have a meander shape.

The MR element 20 is formed into a desired pattern shape by, e.g., photolithography and etching. By providing the dummy pattern 24 in the second region 21e, misalignment of pattern of the MR element 20 during the photolithography process can be prevented, and accurate patterning can be realized.

Advantages of the First Embodiment

In accordance with the MR element 20 according to the first embodiment, the output amplitude can be prevented from decreasing, so that magnetic field detection sensitivity of the whole magnetoresistive element circuit can be enhanced.

The MR elements 20, 30, 40, 50 are each configured such that the pattern forming region 21 has the same shape and the pattern 22 is composed of the linear pattern having the same shape. The pattern forming region 21 may be formed into a quadrangle such as a rectangle, a square, a parallelogram, a trapezoid, or a triangle. Dimension such as a width, a length, a thickness, of the linear part 22a and the turning part 22b of the pattern 22, and contour shape, area and the like of the pattern forming region 21 may be appropriately adjusted so as to provide a large amplitude of output signal to enhance the magnetic field detection sensitivity.

Second Embodiment

Figure 3:
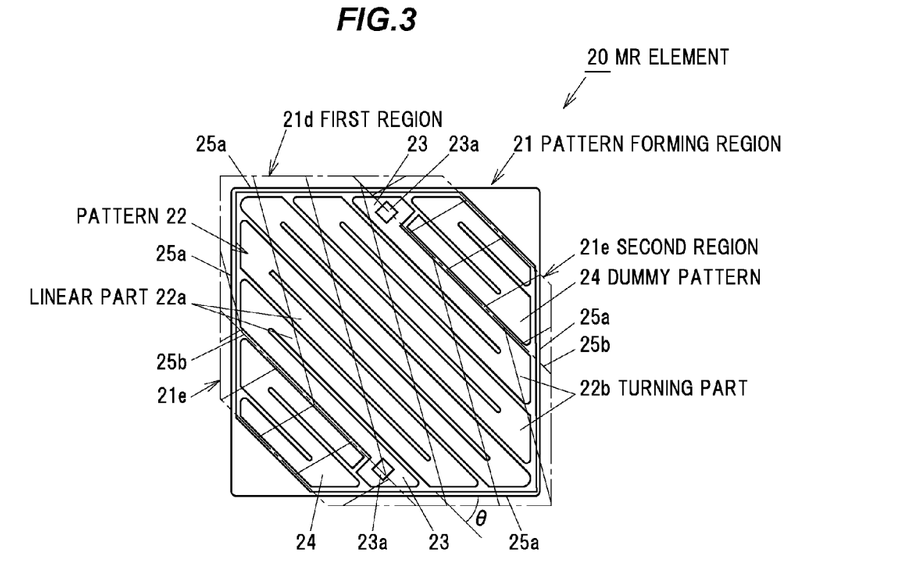
FIG. 3 is a plan view schematically showing a main part of a magnetoresistive element in the magnetic sensor according to a second embodiment of the invention.

Referring to FIG. 3, a main part of the MR element according to the second embodiment is shown. Similarly to the first embodiment, the basic configuration of the second embodiment is mainly characterized by the pattern forming region of the MR element 20. In FIG. 3, the substantially same elements as those in the first embodiment are indicated by the same names and numerals. Therefore, the detail explanation of the same elements will be omitted below.

The second embodiment is different from the first embodiment in the contour shape of the pattern forming region 21 of the MR element 20. As shown in FIG. 3, the contour shape of the pattern forming region 21 is formed to have a square shape in a plan view. The MR element 20 is formed to have a turning shape or meander shape that both end portions in the longitudinal direction of the patterns 22 arranged parallel to each other along the diagonal line of the square are alternately connected. The longitudinal direction of the patterns 22 corresponds to a magnetic field detection direction, and the pattern 22 is configured to elongate in the length by turning the pattern 22.

The first region 21d in the pattern forming region 21 has substantially a hexagonal shape surrounded by the sides (line segments) 25a, 25a adjacent to each other constituting the two corner portions on the one diagonal line, and the two diagonal line segments 25b, 25b parallel to each other intersecting with the side 25a at an inclination angle θ of 45 degrees. On the other hand, the second region 21e configured to be a non-pattern forming region is formed in a trapezoid surrounded by the diagonal line segment 25b of the first region 21d, and the line segments 25a, 25a adjacent to each other constituting the two corner portions on the other diagonal line.

The first region 21d may include a part of the second region 21e to provide a resistance change ratio smaller than that of the first region 21d such that the pattern 22 extends to a part of the second region 21e. In the embodiment shown in FIG. 3, the dummy pattern 24 without the MR element pattern is formed in the second region 21e to have a turning shape or meander shape.

Advantages of the Second Embodiment

The MR element 20 of the second embodiment can also provide a large amplitude of output signal to enhance the magnetic field detection sensitivity.

Third Embodiment

Figure 4:
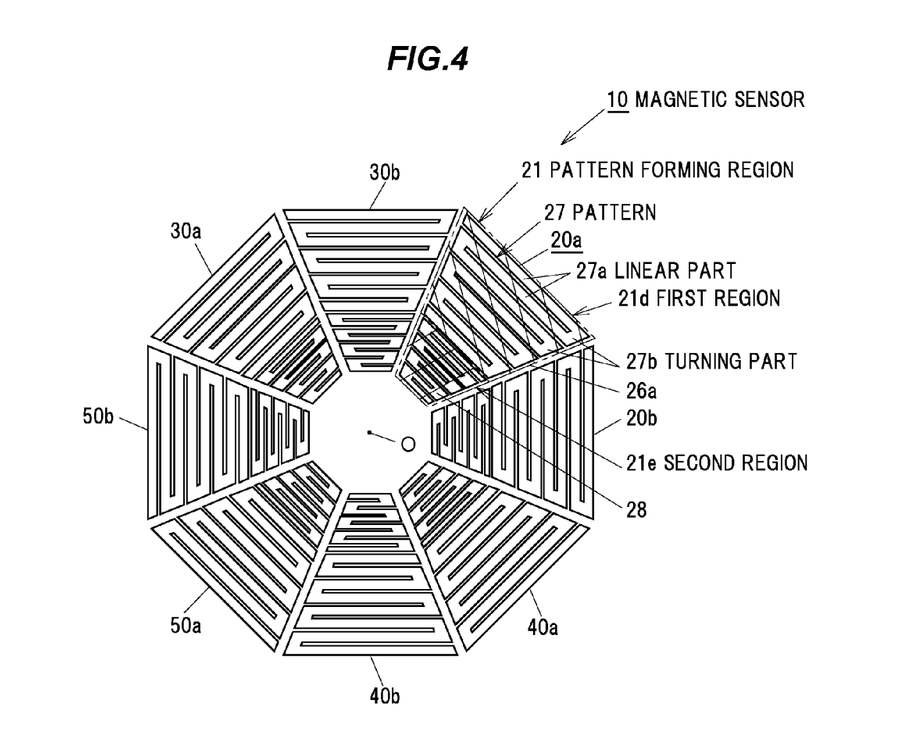
FIG. 4 is a plan view schematically showing a main part of a magnetoresistive element in the magnetic sensor according to a third embodiment of the invention.

Referring to FIG. 4, a main part of the MR element according to the third embodiment is shown. Similarly to the first and second embodiments, the basic configuration of the third embodiment is mainly characterized by the pattern forming region of the MR element. The third embodiment is different from the first embodiment in the configuration of the MR element circuit and the contour shape of the pattern forming region. Further, in FIG. 4, the substantially same elements as those in the first and second embodiments are indicated by the same name and numerals. Therefore, the detail explanation of the same elements will be omitted below.

As shown in FIG. 4, the magnetic sensor 10 is composed of eight MR elements 20a to 50a, 20b to 50b that have the same structure and the same configuration. The MR elements 20a to 50a, 20b to 50b are arranged in a circular shape at phase difference of 45 degrees with a center focus on an intersection point O of the diagonal lines of octagon on the same substrate (not shown).

One full bridge circuit is formed of the four MR elements 20a to 50a, and another full bridge circuit is formed of the four MR elements 20b to 50b. The eight MR elements 20a to 50a, 20b to 50b have the same structure and the same configuration, thus in the third embodiment, only the structure and configuration of MR element 20a will be explained.

As shown in FIG. 4, the contour shape of the pattern forming region 21 of the MR element 20a has substantially a trapezoidal shape in a plan view. The MR element 20a is formed of the patterns 27 arranged parallel to each other at a predetermined equal angle to a pair of line segments 26a, 26a connecting both end portions of the upper base and the lower base of the trapezoid. The patterns 27 are formed to have a turning shape or meander shape that a plurality of linear parts 27a are alternately connected by the turning parts 27b, and the linear parts 27a are formed such that the closer to the upper base of the trapezoid they are, the shorter the length thereof becomes.

As shown in FIG. 4, in the magnetic sensor 10, the first region 21d of the pattern forming region 21 is arranged the outer side (the side of lower base of the trapezoid). On the other hand, the second region 21e as a non-pattern forming region is arranged at the inner side (i.e., at the upper base side of the trapezoid). The first region 21d may include a part of the second region 21e to provide a resistance change ratio smaller than that of the first region 21d, such that the pattern 27 extends to a part of the second region 21e. In the embodiment shown in FIG. 4, the dummy pattern 28 without the MR element pattern is formed in the second region 21e to have a turning shape or meander shape. By the configuration, the magnetic field detection sensitivity of the whole magnetoresistive element circuit can be enhanced without reducing the resistance change ratio of the pattern 27 in the first region 21d.

Advantages of the Third Embodiment

The MR element 20 of the third embodiment can also provide a large amplitude of output signal such that that the magnetic field detection sensitivity can be enhanced. In addition, the magnetic sensor 10 including eight MR elements 20a to 50a, 20b to 50b that have the same structure and the same configuration is configured to be a double full bridge type, so as to be able to continue the detection even if malfunction occurs in one full bridge circuit, by using another full bridge circuit. Due to this, the reliability of detection can be enhanced.

Although the invention has been described with respect to the specific embodiments and depicted examples for complete and clear disclosure, the appended claims are not to be thus limited. In particular, it should be noted that all of the combinations of features as described in the embodiment and depicted examples are not always needed to solve the problem of the invention.

What is claimed is:

1. A magnetic sensor, comprising:
   a substrate; and
   a pattern forming region on the substrate, the pattern forming region having a substantially quadrangle shape,
   wherein the pattern forming region comprises a magnetic detection element pattern that comprises a plurality of linear parts arranged parallel to each other at a predetermined inclination angle to two sides of the quadrangle shape, and a plurality of turning parts configured to alternately connect both end portions in a longitudinal direction of adjacent linear parts of the plurality of linear parts,
   wherein the magnetic detection element pattern further comprises a first pattern, and a second pattern with a resistance change ratio less than the first pattern,
   wherein an area of the magnetic detection element pattern is less than an area of the pattern forming region in a plane view, and
   wherein the pattern forming region further comprises a dummy pattern formed in a region without the magnetic detection element pattern such that the second pattern has a resistance ratio of the turning parts to the linear parts, the resistance ratio being not more than 8%.

2. The magnetic sensor according to claim 1, wherein the pattern forming region has a substantially rectangle shape, and
   wherein the plurality of linear parts of the magnetic detection element pattern are arranged parallel to each other at the inclination angle of 45 degrees to two long sides of the rectangle shape opposite to each other.

3. The magnetic sensor according to claim 1, wherein the pattern forming region has a substantially square shape, and
   wherein the plurality of linear parts of the magnetic detection element pattern are arranged parallel to each other along a diagonal line of the square shape.

4. The magnetic sensor according to claim 1, wherein the magnetic detection element pattern is arranged point-symmetrically with a center focus on an intersection point of diagonal lines of the pattern forming region.

5. The magnetic sensor according to claim 1, further comprising a plurality of magnetic detection elements on the substrate, wherein the magnetic detection elements comprise the pattern forming region having a same shape and the magnetic detection element pattern having a same shape.

6. A pattern for a magnetic sensor, comprising:

a magnetic detection element pattern comprising a plurality of linear parts arranged parallel to each other at a predetermined inclination angle to two sides of a pattern forming region having a substantially quadrangle shape, and a plurality of turning parts configured to alternately connect both end portions in the longitudinal direction of the linear parts adjacent to each other, wherein the magnetic detection element pattern further comprises a first pattern, and a second pattern with a resistance change ratio less than the first pattern, and wherein the pattern forming region comprises a dummy pattern formed in a region without the magnetic detection element pattern such that the second pattern has a resistance ratio of the turning parts to the linear parts, the resistance ratio being not more than 8%.

* * * * *